(12) United States Patent
Qi et al.

(10) Patent No.: US 11,482,545 B2
(45) Date of Patent: Oct. 25, 2022

(54) METHOD OF FORMING ARRAY SUBSTRATE, ARRAY SUBSTRATE AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Yonglian Qi, Beijing (CN); Chao Liu, Beijing (CN); Lianjie Qu, Beijing (CN); Hebin Zhao, Beijing (CN); Shan Zhang, Beijing (CN); Ning Jia, Beijing (CN); Guangdong Shi, Beijing (CN); Shuai Liu, Beijing (CN)

(73) Assignees: BEIJING BOE DISPLAY TECHNOLOGY CO., LTD., Beijing (CN); Beijing BOE Technology Development Co., Ltd., Beijing (CN)

( * ) Notice: Subject to any disclaimer, the term of this patent is extended or adjusted under 35 U.S.C. 154(b) by 86 days.

(21) Appl. No.: 17/040,510

(22) PCT Filed: Mar. 18, 2020

(86) PCT No.: PCT/CN2020/080008
§ 371 (c)(1),
(2) Date: Sep. 22, 2020

(87) PCT Pub. No.: WO2020/192528
PCT Pub. Date: Oct. 1, 2020

(65) Prior Publication Data
US 2021/0193687 A1    Jun. 24, 2021

(30) Foreign Application Priority Data

Mar. 28, 2019 (CN) .......................... 201910243617.9

(51) Int. Cl.
*H01L 27/12* (2006.01)
*H01L 25/075* (2006.01)
*G09G 3/32* (2016.01)

(52) U.S. Cl.
CPC ........ *H01L 27/124* (2013.01); *H01L 25/0753* (2013.01); *H01L 27/1259* (2013.01); *G09G 3/32* (2013.01)

(58) Field of Classification Search
None
See application file for complete search history.

(56) References Cited

U.S. PATENT DOCUMENTS

| 6,133,065 A | 10/2000 | Akram |
| 2006/0230611 A1 | 10/2006 | Wakisaka |

(Continued)

FOREIGN PATENT DOCUMENTS

| CN | 1237035 A | 12/1999 |
| CN | 1774963 A | 5/2006 |

(Continued)

OTHER PUBLICATIONS

ISA China National Intellectual Property Administration, International Search Report and Written Opinion Issued in Application No. PCT/CN2020/080008, dated Jun. 19, 2020, WIPO, 17 pages. (Submitted with Partial Translation).

(Continued)

*Primary Examiner* — Bo B Jang
(74) *Attorney, Agent, or Firm* — McCoy Russell LLP

(57) ABSTRACT

A method of forming an array substrate, the array substrate and a display device are provided. The method of forming the array substrate includes: in a case that a display unit is formed on one of two opposite surfaces of a base substrate and a driving circuit is formed on the other of the two opposite surfaces of the base substrate, performing a rough- (Continued)

ening treatment on edge regions of the two opposite surfaces of the base substrate and a side surface of the base substrate connecting the edge regions of the two opposite surfaces, to form a roughened region; and forming, at the roughened region, a metal wiring connecting a signal input terminal of the display unit and a signal output terminal of the driving circuit.

11 Claims, 3 Drawing Sheets

(56) References Cited

U.S. PATENT DOCUMENTS

| | | |
|---|---|---|
| 2010/0326708 A1 | 12/2010 | Hara et al. |
| 2015/0181718 A1 | 6/2015 | Wang |
| 2016/0225838 A1 | 8/2016 | Im |
| 2018/0190631 A1 | 7/2018 | Kim et al. |

FOREIGN PATENT DOCUMENTS

| | | |
|---|---|---|
| CN | 101930721 A | 12/2010 |
| CN | 103474445 A | 12/2013 |
| CN | 104735915 A | 6/2015 |
| CN | 105551956 A | 5/2016 |
| CN | 108267901 A | 7/2018 |
| CN | 109920762 A | 6/2019 |

OTHER PUBLICATIONS

State Intellectual Property Office of the People's Republic of China, Office Action and Search Report Issued in Application No. 201910243617.9, dated Aug. 4, 2020, 11 pages. (Submitted with Partial Translation).

S101: in a case that a display unit is formed on one of two opposite surfaces of a base substrate and a driving circuit is formed on the other of the two opposite surfaces of the base substrate, performing a roughening treatment on edge regions of the two opposite surfaces of the base substrate and a side surface of the base substrate connecting the edge regions of the two opposite surfaces, to form a roughened region S102: forming, at the roughened region, a metal wiring connecting a signal input terminal of the display unit and a signal output terminal of the driving circuit

Fig. 1

METHOD OF FORMING ARRAY SUBSTRATE, ARRAY SUBSTRATE AND DISPLAY DEVICE

CROSS-REFERENCE TO RELATED APPLICATION

The present application is a U.S. National Phase of International Patent Application Serial No. PCT/CN2020/080008 entitled "METHOD OF FORMING ARRAY SUBSTRATE, ARRAY SUBSTRATE AND DISPLAY DEVICE," filed on Mar. 18, 2020. International Patent Application Serial No. PCT/CN2020/080008 claims priority to Chinese Patent Application No. 201910243617.9 filed on Mar. 28, 2019. The entire contents of each of the above-referenced applications are here by incorporated by reference for all purposes.

TECHNICAL FIELD

The present disclosure relates to the field of display technology, in particular to a method of forming an array substrate, an array substrate and a display device.

BACKGROUND AND SUMMARY

A micro-LED display panel has the advantages of ultra-high pixel count, ultra-high resolution, low energy consumption and long life. Compared with Organic Light-Emitting Diode (OLED), Micro-LED display panel can reduce the distance between pixels to an um level to further optimize the display effect. Therefore, the micro-LED display device is becoming more and more popular in the market.

In a related art, in order to realize a large-size display of a Micro-LED display device, the plurality of small-size Micro-LED display panels need to be spliced together. A front surface and a back surface of each Micro-LED display panels need to be electrically connected. In the related art, the electrical connection between the front faces and back faces of the Micro-LED display panels is prone to misalignment and disconnection, resulting in poor display effects.

A method of forming an array substrate, an array substrate and a display device are provided in the present disclose.

In a first aspect, a method of forming an array substrate is provided in an embodiment of the present disclosure, including:

in a case that a display unit is formed on one of two opposite surfaces of a base substrate and a driving circuit is formed on the other of the two opposite surfaces of the base substrate, performing a roughening treatment on edge regions of the two opposite surfaces of the base substrate and a side surface of the base substrate connecting the edge regions of the two opposite surfaces, to form a roughened region; and forming, at the roughened region, a metal wiring connecting a signal input terminal of the display unit and a signal output terminal of the driving circuit.

Further, the forming, at the roughened region, the metal wiring connecting the signal input terminal of the display unit and the signal output terminal of the driving circuit includes:

oxidizing the roughened region to form an oxide layer at the roughened region;

immersing the oxide layer in a solvent containing metal ions, to deposit the metal ions at the roughened region to form a transition pattern; and forming an electroplating layer by an electroplating process on the transition pattern serving as a electroplating seed layer, where the electroplating layer and the transition pattern together form the metal wiring connecting the signal input terminal of the display unit and the signal output terminal of the driving circuit.

Further, the oxidizing the roughened region to form the oxide layer at the roughened region includes:

immersing the roughened region in an oxidizing solution, forming the oxide layer at the roughened region.

Further, the oxidizing solution is a potassium permanganate solution.

Further, subsequent to the forming the oxide layer at the roughened region and prior to the immersing the oxide layer in the solvent containing the metal ions, the method further includes:

cleaning the edge regions of the two opposite surfaces of the base substrate and the side surface of the base substrate connecting the edge regions of the two opposite surfaces, to remove portions not be oxidized.

Further, the metal ions are silver ions or copper ions.

Further, the method further includes:

performing the roughening treatment on the overall edge regions of two opposite surfaces of the base substrate and the side surface of the base substrate connecting the edge regions of the two opposite surfaces, and forming the roughened region, performing an electroplating at the overall roughened region to form an electroplating layer;

determining a predetermined metal wiring region at the roughened region; and etching and removing the electroplating layer outside the predetermined metal wiring region by a laser etching process, to form the metal wiring.

Further, the performing the electroplating at the overall roughened region is electroplating copper.

Further, the performing the roughening treatment on the edge regions of two opposite surfaces of the base substrate and the side surface of the base substrate connecting the edge regions of the two opposite surfaces to form the roughened region includes:

irradiating the edge regions of two opposite surfaces of the base substrate and the side surface of the base substrate connecting the edge regions of the two opposite surfaces by laser, to increase a roughness degree of the edge regions of two opposite surfaces of the base substrate and the side surface of the base substrate connecting the edge regions of the two opposite surfaces and forming the roughened region.

Further, the performing the roughening treatment on the edge regions of the two opposite surfaces of the base substrate and the side surface of the base substrate connecting the edge regions of the two opposite surfaces to form the roughened region includes:

there exist a plurality of roughened regions spaced apart from each other, the plurality of roughened regions are in a one-to-one correspondence to the metal wirings, the metal wirings are formed within the roughened regions.

In a second aspect, an array substrate formed by the method hereinabove is further provided in an embodiment of the present disclosure, including:

the base substrate, where the display unit is formed on one of the two opposite surfaces of the base substrate and the driving circuit is formed on the other of the two opposite surfaces of the base substrate, the edge regions of the two opposite surfaces and the side surface connecting the edge regions of the two opposite surfaces includes the roughened region;

the metal wiring, where the metal wiring is formed at the roughened region and is configured to connect the signal input terminal of the display unit and the signal output terminal of the driving circuit.

Further, an oxide layer formed by an oxidizing process is arranged at the roughened region, an electroplating seed layer formed by a metal ion deposition is arranged at the roughened region, where the metal wiring is formed on the electroplating seed layer by an electroplating process.

Further, the display units are arranged on an upper surface of the base substrate in an array form, the display unit include a thin film transistor array layer and a Micro LED, the thin film transistor array layer is between the Micro LED and the base substrate.

Further, the display unit and/or the driving circuit are covered by a peelable protective film.

Further, there exist a plurality of roughened regions spaced apart from each other, the plurality of roughened regions are in a one-to-one correspondence to the metal wirings.

In a third aspect, a display device including the array substrate hereinabove is further provided in an embodiment of the present disclosure.

BRIEF DESCRIPTION OF THE FIGURES

In order to illustrate the technical solutions of the present disclosure more clearly, the drawings used in the embodiment descriptions will be described hereinafter briefly. Obviously, the following drawings merely relate to some embodiments of the present disclosure, and based on these drawings, a person skilled in the art may obtain the other drawings without any creative effort.

FIG. 1 is a flowchart of a method of forming an array substrate in some embodiments of the present disclosure;

DETAILED DESCRIPTION

Figure 2:
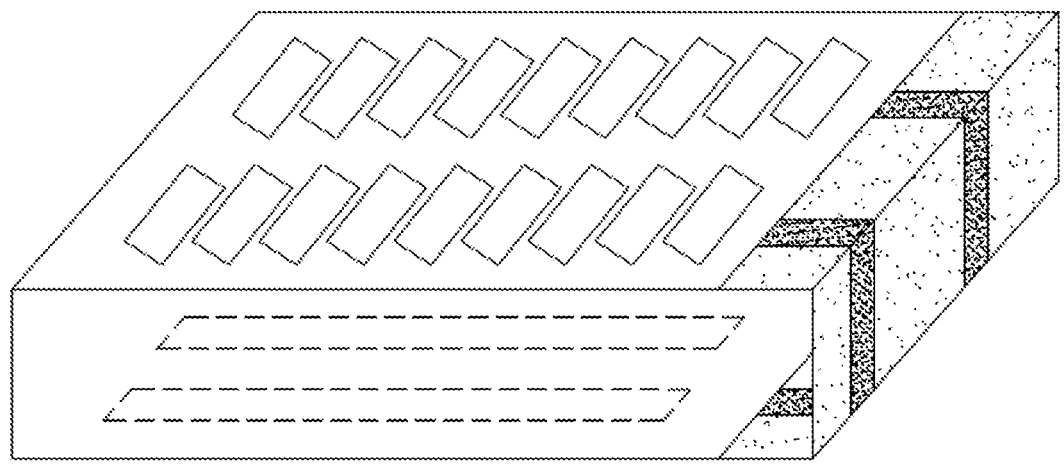
FIG. 2 is a structure schematic diagram of an array substrate in a method of forming an array substrate in some embodiments of the present disclosure.

The technical solutions of the embodiments of the present disclosure will be clearly and completely described below in conjunction with the drawings of the embodiments of the present disclosure. It is apparent that the described embodiments are a part of the embodiments of the present disclosure, and not all of them. Based on the described embodiments of the present disclosure, all other embodiments obtained by those skilled in the art fall within the scope of the disclosure.

Micro LED is a new generation of display technology, which has higher brightness, better luminous efficiency, and lower power consumption than related Organic Light-Emitting Diode (OLED) technology. Therefore, a Micro LED display device is becoming more and more popular. Sometimes, in order to realize a large-scale display of the Micro-LED display device, it is necessary to splice together a plurality of small-sized Micro-LED display panels. A front surface and a back surface of each Micro-LED display panel need to be electrically connected. However, the electrical connection between the front surface and the back surface of the small and medium-sized Micro-LED display panel in the related art is prone to dislocation and disconnection, resulting in poor display effect.

In view of the above problems, a method of forming an array substrate, an array substrate and a display device are provided in some embodiments of the present disclose, which can avoid dislocation or disconnection of electrical connections between the front surface and back surface of the small-size Micro-LED display panel, and ensure that display unit can normally receive a driving signal and ensure the display effect of the display device.

The method of forming the array substrate provided in some embodiments of the present disclosure, as shown in FIG. 1, includes:

step 101: in a case that a display unit is formed on one of two opposite surfaces of a base substrate and a driving circuit is formed on the other of the two opposite surfaces of the base substrate, performing a roughening treatment on edge regions of the two opposite surfaces of the base substrate and a side surface of the base substrate connecting the edge regions of the two opposite surfaces, to form a roughened region;

step 102: forming, at the roughened region, a metal wiring connecting a signal input terminal of the display unit and a signal output terminal of the driving circuit.

In some embodiments of the present disclosure, since the edge regions of the two opposite surfaces of the base substrate and the side surface of the base substrate connecting the edge regions of the two opposite surfaces are subjected to the roughening treatment and then the roughened region is formed, a surface of the roughened region with negative charges can more easily adsorb metal ions with positive charges, thereby avoiding a dislocation when forming the metal wiring. In addition, the surface of the roughened region is microscopically rough, which can increase the contact area with a plating layer, improve the adhesion between the plating layers, avoid disconnection of the metal wiring, ensure that the display unit can receive the driving signal normally and ensure the display effect of the display device. Therefore, the technical solution provided by the present disclosure can ensure the display effect of the display device.

The base substrate may be a flexible base substrate, such as a polyimide film; the base substrate may also be a rigid base substrate, such as a quartz substrate or a glass substrate.

A solid line frame arrayed on an upper surface of the base substrate in FIG. 2 is the display unit as described above, including a thin film transistor array layer and the Micro LED. The thin film transistor array layer is located between the Micro LED and the base substrate; a drain electrode of the thin film transistor in the thin film transistor array layer is connected to the Micro LED; a gate electrode and a source electrode are used to connect to the driving circuit.

A dashed line frame on a lower surface of the base substrate in FIG. 2 is the driving circuit as described above. The driving circuit is used to connect with each thin film transistor in the thin film transistor array layer to drive the corresponding Micro LED to emit light, so that the display device can emit light normally.

A region where a filling pattern in FIG. 2 is located is the edge region of the two opposite surfaces of the base substrate and the side surface of the base substrate connecting the edge regions of the two opposite surfaces, that is, the region where the roughening process is performed. While roughening the overall edge regions and the side surface, the roughened region is formed on the edge regions and the side surface (the part with denser filling pattern in FIG. 2) through a further roughening treatment.

The metal wiring is formed at the roughened region. In the process of forming the metal wiring, a peelable protective film may be formed to cover the display unit and/or the driving circuit, to protect the display unit and the driving circuit from external damage.

The roughened region is a pattern region corresponding to the connection between the driving circuit and the display unit. According to forming the roughened region in advance, the surface of the roughened region with the negative charges can more easily adsorb the metal ion with the positive charges, thereby avoiding the dislocation when forming the metal wiring. In addition, the surface of the roughened region is microscopically rough, which can increase the contact area with the plating layer, improve the adhesion between the plating layers, avoid disconnection of the metal wiring, ensure that the display unit can receive the driving signal normally and ensure the display effect of the display device.

Further, the forming the metal wiring connecting the signal input terminal of the display unit and the signal output terminal of the driving circuit at the roughened region includes:

oxidizing the roughened region, forming an oxide layer at the roughened region;

immersing the oxide layer in a solvent containing metal ions, to deposit the metal ions at the roughened region to form a transition pattern;

forming an electroplating layer by an electroplating process on the transition pattern serving as a electroplating seed layer, where the electroplating layer and the transition pattern together form the metal wiring connecting the signal input terminal of the display unit and the signal output terminal of the driving circuit.

In some embodiments, the transition pattern is formed at the roughened region by a chemical deposition, and taking transition pattern as the electroplating seed layer, the metal wiring located at the roughened region is formed by a way of forming the electroplated layer by a the electroplating process.

The above-mentioned method of oxidizing the roughened region can be oxidizing the roughened region with an oxidant to form the oxide layer at the roughened region, or immersing the roughened region in an oxidizing solution to make the oxidizing solution react with a substance at the roughened region to form the oxide layer at the roughened region. The oxidizing solution may be a potassium permanganate solution, a potassium dichromate and the like. The present disclosure does not limit the specific method used to oxidize the roughened region.

The oxide layer formed above can react in a solution containing metal ions, so that the metal ions in the solution is deposited at the roughened region. After a period of time, a thinner metal film, that is, the transition pattern, can be formed at the roughened region. The transition pattern can realize a conduction between the display unit and the driving circuit. However, the transition pattern is relatively thin, so the transition pattern may be prone to be broken, and the resistance between the display unit and the driving circuit may be relatively large, and the driving circuit cannot normally control the display unit to emit light. Therefore, the electroplating process is required to increase the thickness of the metal at the roughened region.

The electroplating process is a method of laying a layer of metal on the electroplating seed layer based on a principle of electrolysis. During the electroplating process, the metal ions are deposited on the electroplating seed layer, thereby increasing the thickness of the metal at the roughened region, thereby not only avoiding the disconnection between the display unit and the driving circuit, but also reducing the resistance between the display unit and the driving circuit, so that the driving circuit can normally control display unit to emit light.

The metal ions may be copper ions or silver ions. When the metal ions are copper ion, the transition pattern and electroplating layer are both formed by a copper ion deposition; when the metal ions are silver ions, the transition pattern and electroplating layer are both formed by a silver ion deposition.

Optionally, in another embodiments, the method further may include: performing the roughening treatment on the overall edge regions of two opposite surfaces of the base substrate and the side surface of the base substrate connecting the edge regions of the two opposite surfaces, and forming the roughened region, performing an electroplating at the overall roughened region to form an electroplating layer; determining a predetermined metal wiring region at the roughened region; and etching and removing the electroplating layer outside the predetermined metal wiring region by a laser etching process, to form the metal wiring.

Further, the performing the overall electroplating at the roughened region is electroplating copper.

Optionally, subsequent to the forming the oxide layer at the roughened region and prior to the immersing the oxide layer in the solvent containing the metal ions, the method further includes:

cleaning the edge regions of the two opposite surfaces of the base substrate and the side surface of the base substrate connecting the edge regions of the two opposite surfaces, to remove portions not be oxidized.

Specifically, in the cleaning step, ionized water or low-concentration acid may be used to clean the edge regions of the two opposite surfaces of the base substrate and the side surfaces of the base substrate connecting the edge regions of the two opposite surfaces.

After the oxide layer is formed, not only an oxidizing agent or the oxidizing solution, but also an unoxidized part is remained in the edge regions of the two opposite surfaces of the base substrate and the side surfaces of the base substrate connecting the edge regions of the two opposite surfaces. In some embodiments, by cleaning the substances hereinabove, it is possible to prevent these substances from affecting the subsequent deposition of the metal ions on the oxide layer in the solution containing metal ions, so as to ensure that the metal ion can be smoothly deposited at the roughened region to form the transition pattern.

Further, the performing the roughening treatment on the edge regions of two opposite surfaces of the base substrate and the side surface of the base substrate connecting the edge regions of the two opposite surfaces to form the roughened region includes:

irradiating the edge regions of two opposite surfaces of the base substrate and the side surface of the base substrate connecting the edge regions of the two opposite surfaces by laser, to increase a roughness degree of the edge regions of two opposite surfaces of the base substrate and the side surface of the base substrate connecting the edge regions of the two opposite surfaces and forming the roughened region.

In some embodiments, the roughening treatment is performed on the edge regions of the two opposite surfaces of the base substrate and the side surfaces of the base substrate connecting the edge regions of the two opposite surfaces by means of laser irradiating, and the roughened region is formed. The laser used may be an ultraviolet (UV) laser or an excimer laser.

The overall edge region of the opposite surfaces of the base substrate and the side surface of the edge region of the base substrate connecting the opposite surfaces are irradiated and roughened by the laser. Then, an irradiating parameter is adjusted to perform the irradiation according to a predetermined wiring pattern for the display unit and the driving circuit, so as to form the roughened region.

Optionally, there exist a plurality of roughened regions spaced apart from each other, the plurality of roughened regions are in a one-to-one correspondence to the metal wirings, the metal wirings are formed within the roughened regions.

In another embodiments of the present disclosure, the roughening treatment on the edge regions of the two opposite surfaces of the base substrate and the side surfaces of the base substrate connecting the edge regions of the two opposite surfaces and forming of the roughened region may be performed by another way.

Figure 3:
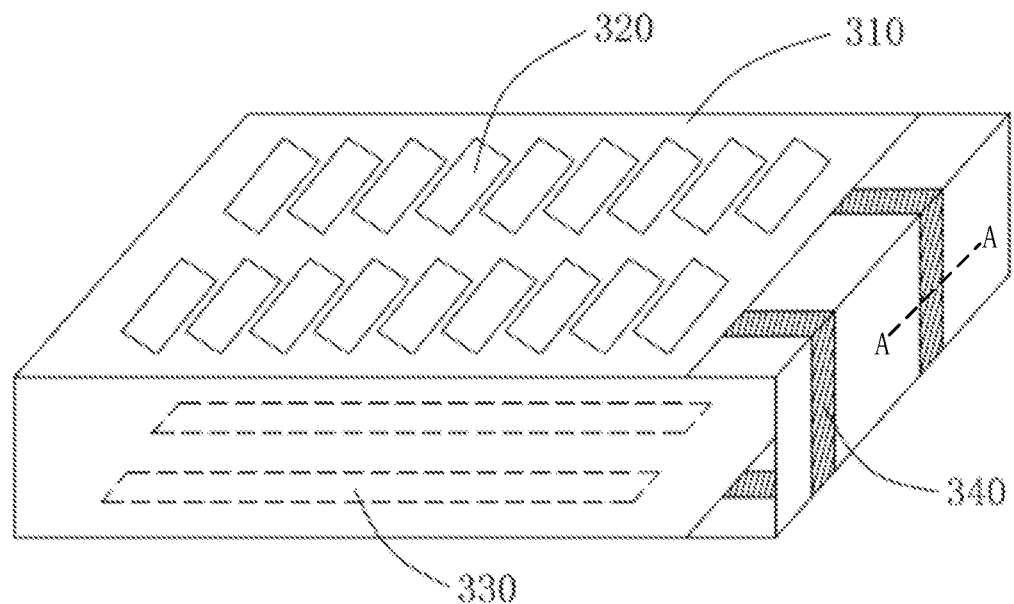
FIG. 3 is a structural schematic diagram of an array substrate in some embodiments of the present disclosure.

As shown in FIG. 3, an array substrate is provided in some embodiments of the present disclosure, including:

the base substrate 310, in which the display unit 320 are formed on one of the two opposite surfaces of the base substrate 310 and the driving circuit 330 of the base substrate 310 is formed on the other surface, the edge regions of the two opposite surfaces and the side surfaces connecting the edge regions of the two opposite surfaces includes the roughened region;

the metal wiring 340, in which the metal wiring is formed at the roughened region and is configured to connect the signal input terminal of the display unit 320 and the signal output terminal of the driving circuit 330.

Figure 4:
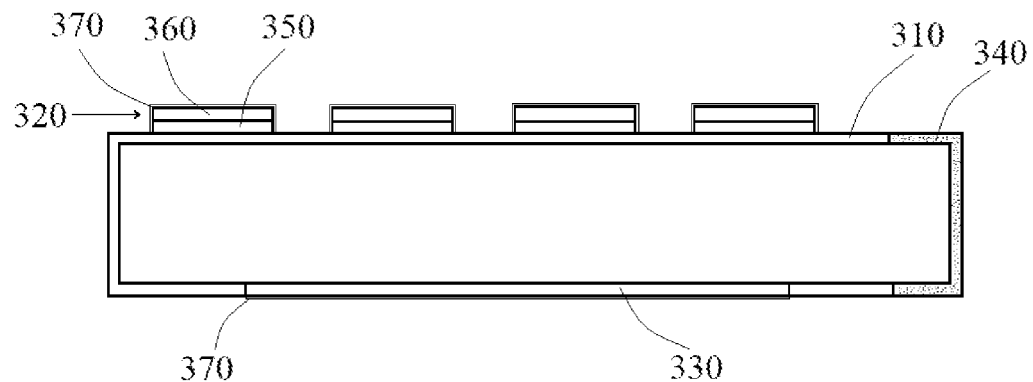
FIG. 4 is a side view of an array substrate in some embodiments of the present disclosure.

Optionally, as shown in FIG. 4, FIG. 4 is a side view of the array substrate in some embodiments of the present disclosure. The display unit 320 are arrayed on an upper surface of the base substrate 310, the display unit 320 include the thin film transistor array layer 350 and the Micro LED 360, the thin film transistor array layer 350 is located between the Micro LED 360 and the base substrate 310. The drain electrode of the thin film transistor in the thin film transistor array layer 350 is connected to the Micro LED, and the gate electrode and source electrode are used to connect to the driving circuit 330.

Optionally, the peelable protective film 370 covers the display unit 320 and/or the driving circuit 330.

Figure 5:
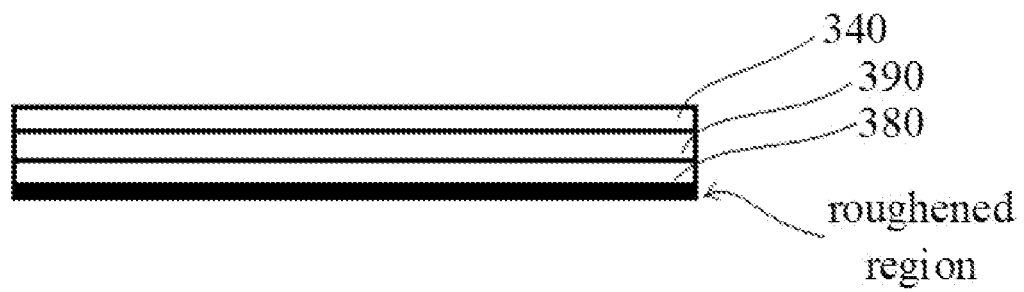
FIG. 5 is a cross-sectional view of a roughened region at the position of an AA cross-section in FIG. 3.

Optionally, as shown in FIG. 5, FIG. 5 is a cross-sectional view of the roughened region at the position of an AA cross-section in FIG. 3. The oxide layer 380 formed by oxidizing is arranged at the roughened region, the electroplating seed layer 390 formed by metal ion deposition is arranged at the roughened region, the metal wiring 340 is formed on the electroplating seed layer 390 by electroplating.

In the related art, it is necessary to chamfer and grind a vertical angle between the edge region of the opposite surfaces of the base substrate and the side surfaces of the base substrate connecting the two opposite surfaces, that is, to grind a vertical edge to a relatively gentle angle, so as to make the metal wiring on the side to connect to the display unit and the driving circuit, otherwise a metal printing and alignment at right angles may not be performed by a mobile printing.

The array substrate is formed by the above-mentioned method of forming the array substrate, so there is no need to perform the chamfering and edging process. The metal wiring 340 may be prevented from being misplaced or broken at right angles, and the display unit 320 may be ensured to receive the driving signal normally, so as to ensure the display effect of the display device.

A display device including the array substrate hereinabove is provided in some embodiments of the present disclosure.

The display device may be a display screen, a mobile phone, a tablet computer, a television, a wearable electronic device, a navigation display device, and the like.

In some embodiments the present disclosure, since the edge regions of the two opposite surfaces of the base substrate and the side surface of the base substrate connecting the edge regions of the two opposite surfaces are performed the roughening treatment and the roughened region is formed, a surface of the roughened region with negative charges can more easily adsorb metal ions with positive charges, avoiding dislocation when forming the metal wiring. In addition, the surface of the roughened region is microscopically rough, which can increase the contact area with a plating layer, improve the adhesion between the plating layers, avoid disconnection of the metal wiring, ensure that the display unit can receive the driving signal normally and ensure the display effect of the display device. Therefore, the technical solution provided by the present disclosure can ensure the display effect of the display device.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "comprising" and the like mean that an element or an article preceding the term contains elements or items and equivalents thereof behind the term, but does not exclude other elements or items. Such terms as "connect", or "interconnected" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

The above embodiments are merely some embodiments of the present disclosure. It should be noted that numerous improvements and modifications may be made by those skilled in the art without departing from the principle of the present disclosure, and these improvements and modifications shall also fall within the scope of the present disclosure.

The invention claimed is:

1. A method of forming an array substrate, comprising:
providing a base substrate, wherein a display unit is formed on one of two opposite surfaces of the base substrate and a driving circuit is formed on the other of the two opposite surfaces of the base substrate, performing a roughening treatment on edge regions of the two opposite surfaces of the base substrate and a side surface of the base substrate connecting the edge regions of the two opposite surfaces, to form a plurality of roughened regions spaced apart from each other, and a surface of each roughened region carries negative charges; and forming, at the plurality of roughened regions, a plurality of metal wirings each connecting a signal input terminal of the display unit and a signal output terminal of the driving circuit, the plurality of roughened regions is in a one-to-one correspondence to the plurality of metal wirings;

wherein the forming, at the plurality of roughened regions, the plurality of metal wirings comprises:
  oxidizing the plurality of roughened regions to form an oxide layer at the plurality of roughened regions;
  immersing the oxide layer in a solvent containing metal ions, to deposit the metal ions at the plurality of roughened regions to form a transition pattern; and
  forming an electroplating layer by an electroplating process on the transition pattern serving as an electroplating seed layer, wherein the electroplating layer and the transition pattern together form the plurality of metal wirings.

2. The method according to claim 1, wherein the oxidizing the plurality of roughened regions to form the oxide layer at the plurality of roughened regions comprises:
  immersing the plurality of roughened regions in an oxidizing solution, forming the oxide layer at the plurality of roughened regions.

3. The method according to claim 2, wherein the oxidizing solution is a potassium permanganate solution.

4. The method according to claim 2, wherein subsequent to the forming the oxide layer at the plurality of roughened regions and prior to the immersing the oxide layer in the solvent containing the metal ions, the method further comprises:
  cleaning the edge regions of the two opposite surfaces of the base substrate and the side surface of the base substrate connecting the edge regions of the two opposite surfaces, to remove portions not be oxidized.

5. The method according to claim 1, wherein the metal ions are silver ions or copper ions.

6. The method according to claim 1, wherein the performing the roughening treatment on the edge regions of the two opposite surfaces of the base substrate and the side surface of the base substrate connecting the edge regions of the two opposite surfaces to form the plurality of roughened regions comprises:
  irradiating the edge regions of the two opposite surfaces of the base substrate and the side surface of the base substrate connecting the edge regions of the two opposite surfaces by laser, to increase a roughness degree of the edge regions of the two opposite surfaces of the base substrate and the side surface of the base substrate connecting the edge regions of the two opposite surfaces and forming the plurality of roughened regions.

7. An array substrate formed by the method according to claim 1, comprising:
  the base substrate, wherein the display unit is formed on one of the two opposite surfaces of the base substrate and the driving circuit is formed on the other of the two opposite surfaces of the base substrate, the edge regions of the two opposite surfaces and the side surface connecting the edge regions of the two opposite surfaces comprises the plurality of roughened regions;
  the plurality of metal wirings, wherein the plurality of metal wirings is formed at the plurality of roughened regions and is configured to connect the signal input terminal of the display unit and the signal output terminal of the driving circuit.

8. The array substrate according to claim 7, wherein an oxide layer formed by an oxidizing process is arranged at the plurality of roughened regions, an electroplating seed layer formed by a metal ion deposition is arranged at the plurality of roughened regions, wherein the metal wiring is formed on the electroplating seed layer by an electroplating process.

9. The array substrate according to claim 7, wherein a plurality of display units comprising the display units are arranged on the one of the two opposite surfaces of an upper surface of the base substrate in an array form, each display unit comprises a thin film transistor array layer and a Micro Light-Emitting Diode (LED), the thin film transistor array layer is between the Micro LED and the base substrate.

10. The array substrate according to claim 7, wherein the display unit and/or the driving circuit are covered by a peelable protective film.

11. A display device comprising the array substrate according to claim 7.

* * * * *